United States Patent [19]

Sickles et al.

[11] Patent Number: 5,660,122
[45] Date of Patent: Aug. 26, 1997

[54] FINELY ADJUSTABLE MOUNTING SYSTEM AND PANEL FOR HOLDING PLANAR ARTICLES AND STORAGE UNIT USING BOTH

[75] Inventors: Willard J. Sickles, Dalton; Jeffrey C. Olson, Wilkes-Barre; André F. Kabacinski, Moosic, all of Pa.

[73] Assignee: Metro Industries, Inc., Reno, Nev.

[21] Appl. No.: 393,911

[22] Filed: Feb. 24, 1995

[51] Int. Cl.⁶ .................................................. A47B 3/00
[52] U.S. Cl. ................................................... 108/193
[58] Field of Search ................. 211/41, 175; 108/193, 108/102, 137, 153

[56] References Cited

U.S. PATENT DOCUMENTS

| | | | |
|---|---|---|---|
| 3,332,558 | 7/1967 | Wilson | 211/175 |
| 3,604,369 | 9/1971 | Maslow . | |
| 3,757,705 | 9/1973 | Maslow . | |
| 3,838,777 | 10/1974 | Thornicroft et al. | 211/41 |
| 3,999,663 | 12/1976 | Walter et al. | 211/175 |
| 4,382,517 | 5/1983 | Welsch . | |
| 4,385,781 | 5/1983 | Welsch et al. | 211/41 X |
| 4,538,211 | 8/1985 | Bertellotti et al. | 211/41 X |
| 4,657,146 | 4/1987 | Walters | 211/41 |
| 4,874,098 | 10/1989 | Moulds | 211/41 X |
| 4,919,277 | 4/1990 | Jeruzal | 211/41 |
| 5,303,645 | 4/1994 | Meacham . | |
| 5,378,093 | 1/1995 | Schroeder | 211/41 X |
| 5,393,136 | 2/1995 | Grabowski et al. | 211/175 X |

OTHER PUBLICATIONS

Southco Fasteners Handbook 32, "Southco No. 56 Spring-loaded Plunger". (1982), p. J–14.

Primary Examiner—Jose V. Chen
Attorney, Agent, or Firm—Fitzpatrick, Cella, Harper & Scinto

[57] ABSTRACT

An adjustable mounting system includes a tab having a plurality of holes formed thereon at first regular intervals horizontally across the tab, a member having a plurality of openings formed thereon at second regular intervals different from the first regular intervals. A fastener detachably connects the member and the tab by passing through one of the plurality of holes and one of the plurality of openings aligned with one of the plurality of holes. Panels have recessed portions formed on their surfaces between raised portions having a bisected-diamond shape. Planar articles, such as printed circuit boards and the like can be inserted in the recessed portions and held either horizontally or at an angle. The panels are removably mounted to a frame using the adjustable mounting system.

59 Claims, 6 Drawing Sheets

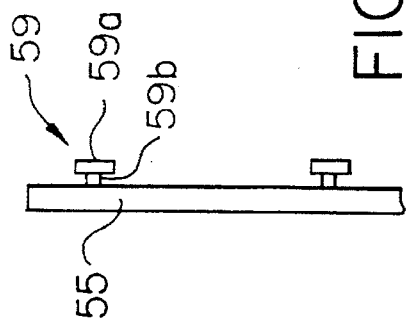
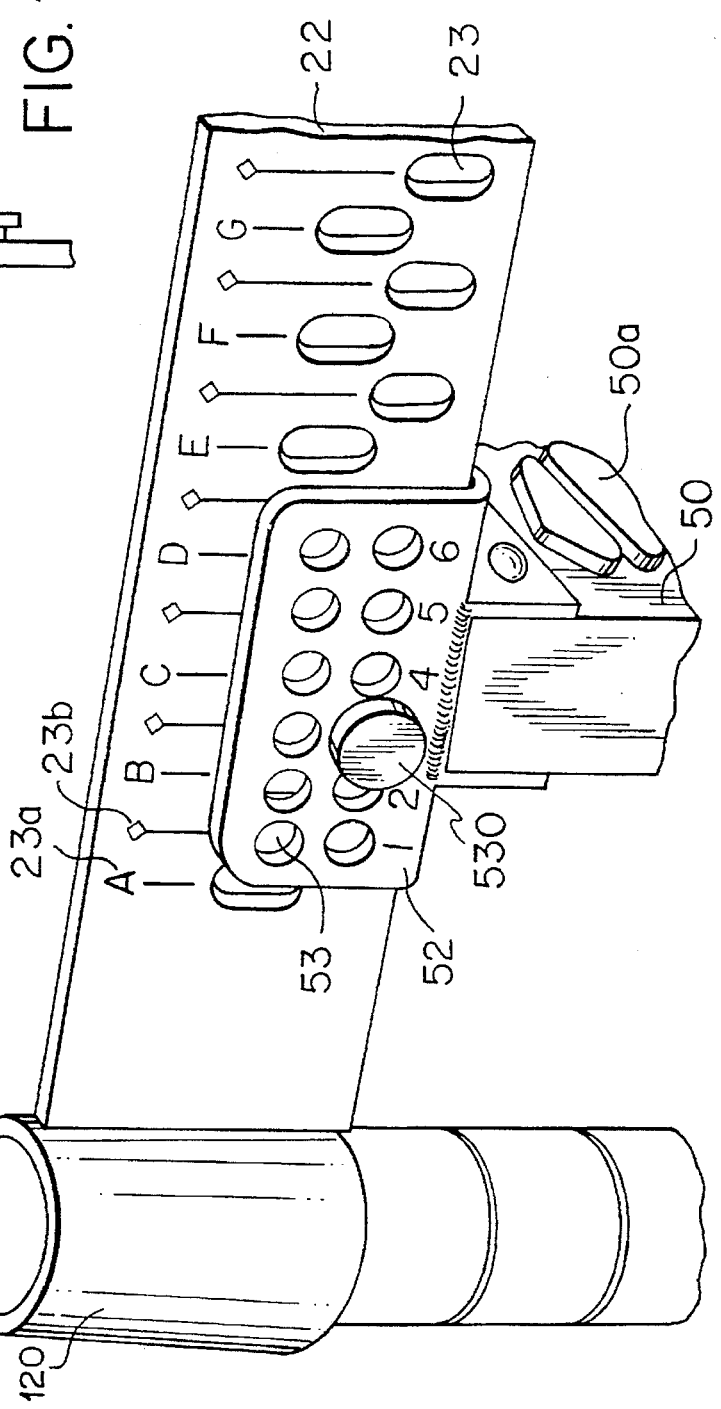
FIG. 12
FIG. 5

FINELY ADJUSTABLE MOUNTING SYSTEM AND PANEL FOR HOLDING PLANAR ARTICLES AND STORAGE UNIT USING BOTH

BACKGROUND OF THE INVENTION

1. Field of the Invention

The present invention relates generally to a finely adjustable mounting system. The invention further relates to panels capable of supporting substantially planar articles such as printed circuit boards (sometimes referred to herein as either "boards" or "PCBs"). The panels may be connected to a storage unit using the mounting system.

2. Description of the Prior Art

Adjustable storage units with panels connected thereto find utility in a wide variety of environments and applications. In one industrial application, for example, a specially configured storage system serves as a storage unit, and panels forming part of the storage unit hold PCBs. Typically, boards are stored by supporting only their edges to avoid damage to the components mounted thereon. Because the PCBs can vary widely in size, and usually have only a small margin at their edges available for being supported without disturbing the components thereon, the system must be adjustable within close tolerances to securely hold the PCBs. Accordingly, storing PCBs presents special challenges to storage system designers.

Adjustable storage units are useful in many phases of PCB manufacture. Typically, the assembly of PCBs includes the steps of forming the circuit runs on the boards, mounting electronic components and connectors, soldering the electronic components and connectors, placing a protective coating on the boards, and testing the completed boards for faults and performance. Each of these steps may take place at a separate work station in an assembly plant, necessitating transport of the PCBs between locations and possible storage of the PCBs at each work station pending completion of a particular assembly step.

PCBs are relatively fragile and oftentimes very expensive to make, especially to make fault-free. Accordingly, an adjustable storage system for securely holding the PCBs for transport and/or storage is commercially very important to avoid damage to the PCBs and the related unnecessary expense.

Storage systems are known in the prior art having a pair of opposing panels disposed vertically to hold the edges of the boards. One or both side surfaces of the panels have raised portions creating grooves for receiving the edges of the boards. The raised portions may be diamond-shaped to create the grooves therebetween, which hold the boards at an angle. One such storage system is described in U.S. Pat. No. 4,382,517 which is incorporated herein by reference.

In the storage system described in the '517 patent, the panels are movably supported along parallel, horizontal support members disposed within cut-out portions of the panels. Thumbscrews threaded through openings on the edges of the panels secure the panels to the support members at any selected location.

The panel described in the '517 patent includes a vertical partition member dividing the panel into two sections. The partition member can be attached at different locations on the surface of the panel permitting different size printed circuit boards to be loaded on the panel on either side of the partition member.

The need for an adjustable storage system wherein a pair of opposing panels may be precisely positioned to hold PCBs of various sizes with close tolerances has been identified. There is also a need for this precise positioning to be repeatable every time a particular PCB size is to be held. Moreover, a need has been identified for the opposing panels to be able to hold the PCBs both at an angle or horizontally.

SUMMARY OF THE INVENTION

It is an object of the present invention to provide an adjustable mounting system permitting fine adjustment of a mounting position.

It is another object of the present invention to provide an adjustable mounting system in which a particular mounting position is identifiable and repeatable.

It is another object of the present invention to provide a support structure with one or more adjustable panels that improves upon those known in the art.

It is another object of the present invention to provide a support structure with one or more panels that are adjustably mounted thereon to accommodate printed circuit boards of various sizes.

It is a further object of the present invention to provide one or more adjustable panels, each panel being capable of holding an edge of PCBs both horizontally and at an angle.

It is yet another object of the present invention to provide a storage system with one or more adjustable panels which may be completely assembled, disassembled and reconfigured without tools.

To achieve these and other objects, a storage system with one or more adjustable panels is provided. The panels have recesses; i.e., grooves, formed on one or both sides to accommodate edges of generally planar articles, such as PCBs. Tabs connected to the panels have rows of holes across their surface. Frame members forming part of a support structure in one embodiment of the invention have elongated openings spaced in a staggered configuration. The arrangement of the holes and tabs is such that a hole may align with an elongated opening, permitting the tabs on a panel to be fastened to the frame member by inserting a fastener through the aligned hole and opening. The panels may be attached to a support structure at regular, closely-spaced positions.

The panels of the preferred embodiment have raised portions with a bisected-diamond-type shape which create grooves to accommodate PCBs both horizontally and at an angle.

BRIEF DESCRIPTION OF THE DRAWINGS

FIG. 5 is a partially-fragmented, perspective view illustrating the attachment of the tab to the frame member in the first embodiment.

FIG. 12 is an elevation of a partition member for defining sections of the panel illustrated in FIG. 9.

DETAILED DESCRIPTION OF THE PREFERRED EMBODIMENTS

Figure 1:
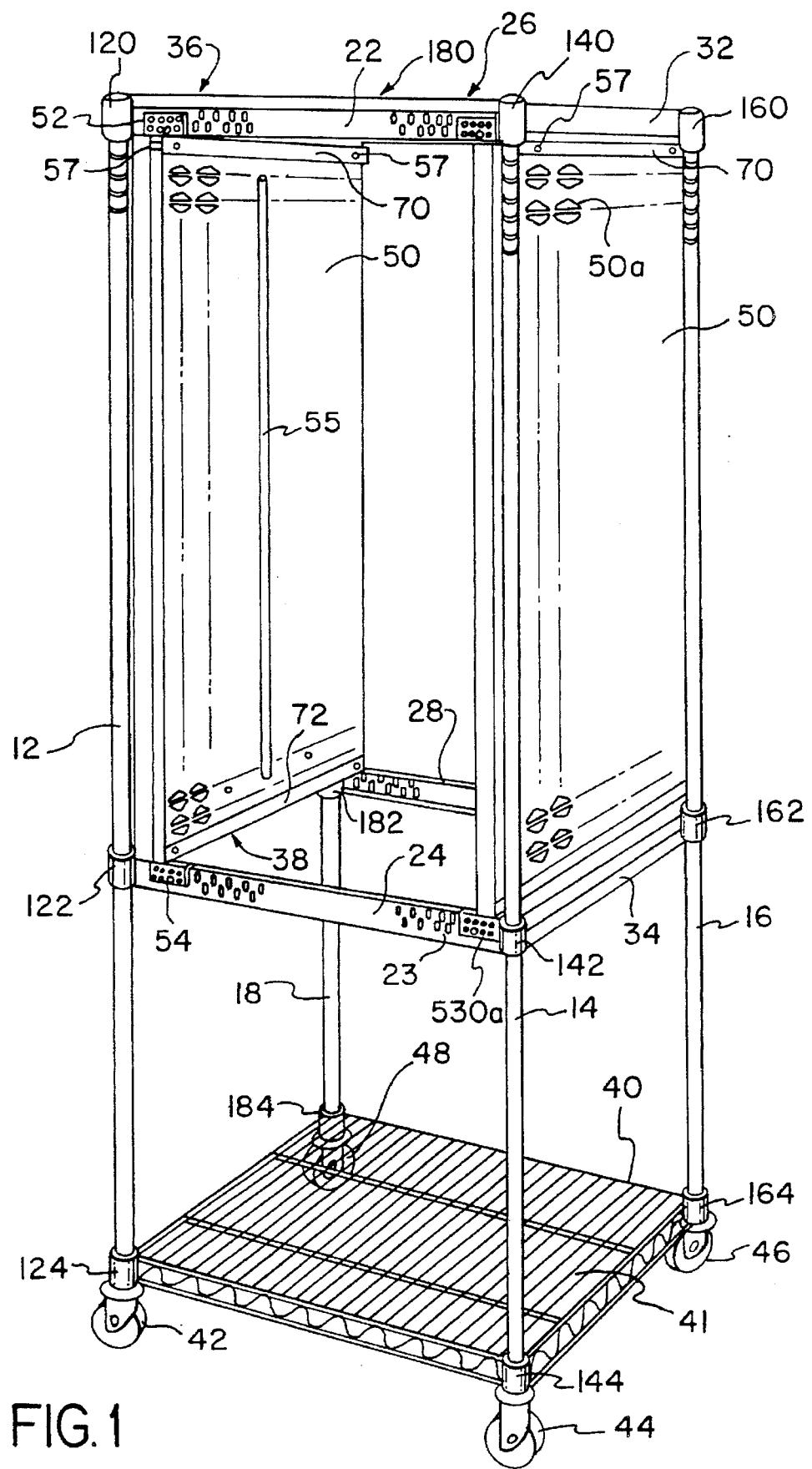
FIG. 1 is a perspective view of an adjustable storage system having movable panels for holding PCBs, illustrating a preferred embodiment of the invention.

FIG. 1 shows one example of a storage unit using the mounting system of the present invention. Adjustable storage system 10 is shown in FIG. 1 utilizing a mounting system embodying the present invention. Of course, the mounting system described herein may be used in any other structure in which one member must be attachable to another in a finely adjustable and reproducible manner. In one preferred arrangement, the storage system may be constructed using an Intermetro Industries SUPER ERECTA storage system, as described, for example, in U.S. Pat. Nos. 3,604,369; 3,757,705; and 5,303,645, which are herein incorporated by reference.

Storage system 10 includes support posts 12, 14, 16, and 18 joined to upper and lower horizontal front and back frame members 22, 24, 26, and 28. Upper and lower front frame members 22 and 24 are parallel with each other and with upper and lower back frame members 26 and 28, respectively.

Upper side members 32 and 36 extend generally perpendicularly between upper front frame members 22 and 26. The upper side members and upper frame members are joined at collars 120, 140, 160, and 180, forming a generally rectangular upper support structure. Side members 32 and 36 are perpendicular to both the upper frame members 22 and 26, and to posts 12, 14, 16 and 18. Likewise, lower side members 34 and 38 and lower horizontal frame members 24 and 28 are joined at collars 122, 142, 162, and 182, and form a generally rectangular lower support structure. Side members 34 and 38 are perpendicular to both lower frame members 24 and 28, and to posts 12, 14, 16, and 18.

A bottom shelf assembly 40 adds increased rigidity to the storage system 10 and also serves as a storage level. Bottom shelf assembly 40 includes a plurality of side members being joined at a plurality of collars 124, 144, 164, and 184 to form a generally rectangular shelf assembly. A platform 41 is secured to the side members. The side members and the platform may be fabricated from wire rods. Typically, the side members, platform, and collars are secured by welding, brazing, and the like. Of course, additional shelf assemblies may be added if space permits.

The upper and lower support structures and bottom shelf are removably attached at their corners to each of the support posts 12, 14, 16, and 18 by means of the collars 120, 122, 140, 142, 160, 162, 180, and 182 and a split frusto-conical insert (not shown). The posts have a plurality of grooves formed around their circumferences. A circumferential projection on an inside surface of the insert engages a groove on the post and the collar is placed over and holds the insert in place, thereby securing the upper and lower frames and the bottom shelf assembly to the posts 12, 14, 16, and 18.

A pair of opposing panels 50 are removably secured to the upper and lower frame members 22 and 26. One or more PCBs can be supported between the panels 50.

Although the embodiment shown in FIG. 1 shows both panels being movable along frame members 22, 24, 26, and 28, the invention also contemplates the use of one movable panel and one fixed panel. The fixed panel may be welded or bolted into place. The invention also encompasses the use of more than two panels, allowing for the storage of more than one column of PCBs.

To convert the storage system to a truck or cart, casters 42, 44, 46, and 48 may be secured to the bottom of each support post 12, 14, 16, and 18 to facilitate moving the storage system 10.

Figure 2:
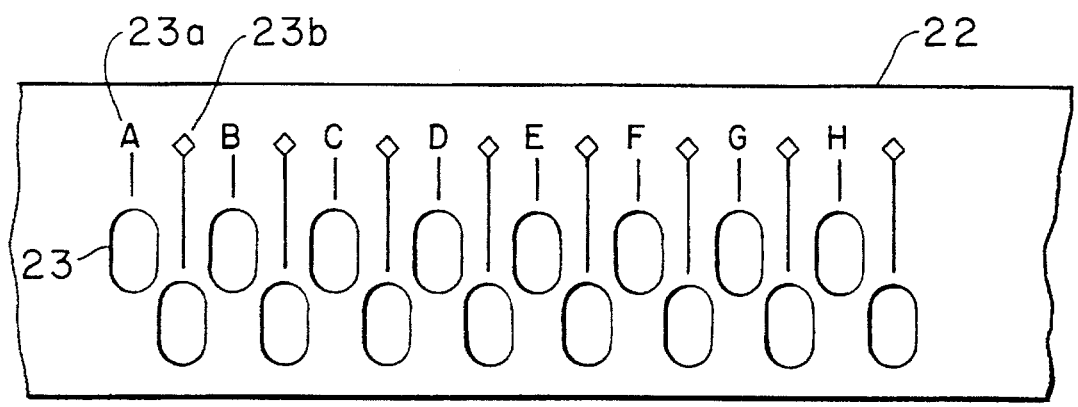
FIG. 2 is a partially-fragmented, elevation of a portion of a frame member used in the adjustable storage system shown in FIG. 1 illustrating a first embodiment of the openings located therein.

FIG. 2 shows an enlarged view of a portion of frame member 22 illustrating a preferred arrangement of the elongated openings 23. Frame members 24, 26, and 28 also use a like arrangement. As depicted, two rows of openings 23 are arranged in a staggered fashion across at least part of the surface of the frame member. The staggered configuration of the openings allows an increased number of openings per unit length of the frame member. As will be explained in more detail below, this arrangement permits the panel system 10 to accommodate a greater variety of board sizes because the distance between panels can be varied in small increments. The elongated shape of the openings compensates for any vertical misalignment.

According to one preferred embodiment, the center line distance between adjacent upper and lower openings 23 on the frame member is 0.30 inches. Accordingly, the distance between neighboring upper openings is 0.60 inches, as is the distance between neighboring lower openings. The horizontal distance measured across the center of each opening 23, i.e., its minor axis, is 0.25 inches. Of course, other dimensions may be selected.

Indices 23a and 23b for each of the openings 23 on frame 22 are provided to facilitate the mounting of the panels in the storage system. In FIG. 2, letters alternating with diamond-shaped markers 23b are used as indices, but any unique index may be used to distinguish each of the openings. The indices may be added by labelling, embossing, etching, painting, and the like.

Openings 23 on frame members 22 permit attachment and positioning of the panels configured to hold the edges of the circuit boards. A preferred mode of attachment is described below.

Attachment of Panels to Frame Members

As shown in FIG. 1, panels 50 are removably mounted to frame members 22, 24, 26, and 28. Brackets 70 and 72 are secured to the upper and lower edges of panel 50 with a plurality of fasteners, such as rivets 57. These brackets, in one embodiment, are made of metal, but may also be made of other materials, such as plastics. Tabs 52 and 56 are secured to bracket 70 by means of welding, brazing, or the like. Likewise, tabs 54 and 58 are secured to a bracket 72 disposed at the bottom edge of panel 50.

The distance between tabs 52 and 56, and between tabs 54 and 58 along the top and bottom edges of the panel, is set so as to permit attachment of tabs 52, 54, 56, and 58 to frame members 22, 24, 26, and 28, respectively.

Figure 3:
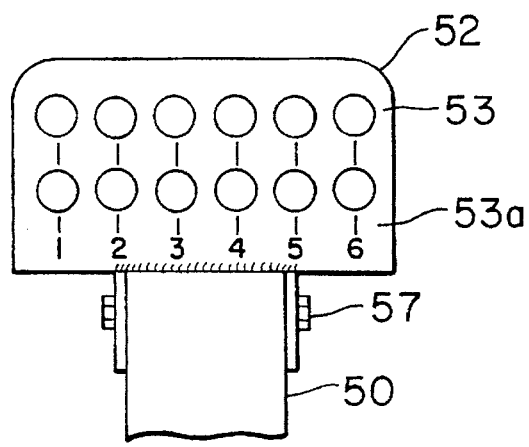
FIG. 3 is a partially-fragmented, elevation of a mounting tab attached to a panel used in the adjustable storage system shown in FIG. 1, illustrating a first embodiment of an arrangement of holes disposed on the tab.

As shown in FIG. 3, two rows of six circular holes 53 each are formed in tab 52. Holes 53 in each row are vertically-aligned, forming six columns of two holes each. In a preferred embodiment, each of the circular holes has a diameter of 0.25 inches, the same width as that of the minor axis of the openings on the frame, to further assure a precise alignment of the holes 53 with the openings 23.

In this embodiment, the horizontal distance between the center lines of each of the holes is 0.35 inches. Numbers identify each column of holes in the embodiment illustrated in FIG. 3, but any identifying symbol, color, or the like may be used. Again, the numbers may be added by labelling, embossing, etching, painting, and the like.

Referring to FIG. 1, a panel 50 is mounted on upper frame members 22 and 26 by securing tabs 52 and 56 to frame members 22 and 26, respectively. Similar attachment is also made at the bottom of the panel to lower frame members 24 and 28 by tabs 54 and 58. (Tabs 56 and 58 are not shown in FIG. 1.) One of holes 53 on the each of tabs 52, 54, 56, and 58 is aligned with one of openings 23 on each of the corresponding frame members. Each tab may be secured to a corresponding frame member by means of a removable pin 530, machine screw and nut, and the like. As another means of attaching the frame and tab, a single rod can be passed through the aligned hole and opening at one side of panel 50 and through the aligned hole and opening at an opposite end of panel 50. The diameter of the fastener is sized to fit snugly within the aligned hole and opening. In a preferred embodiment, the fastener has a diameter slightly less than 0.25 inches.

Figure 4:
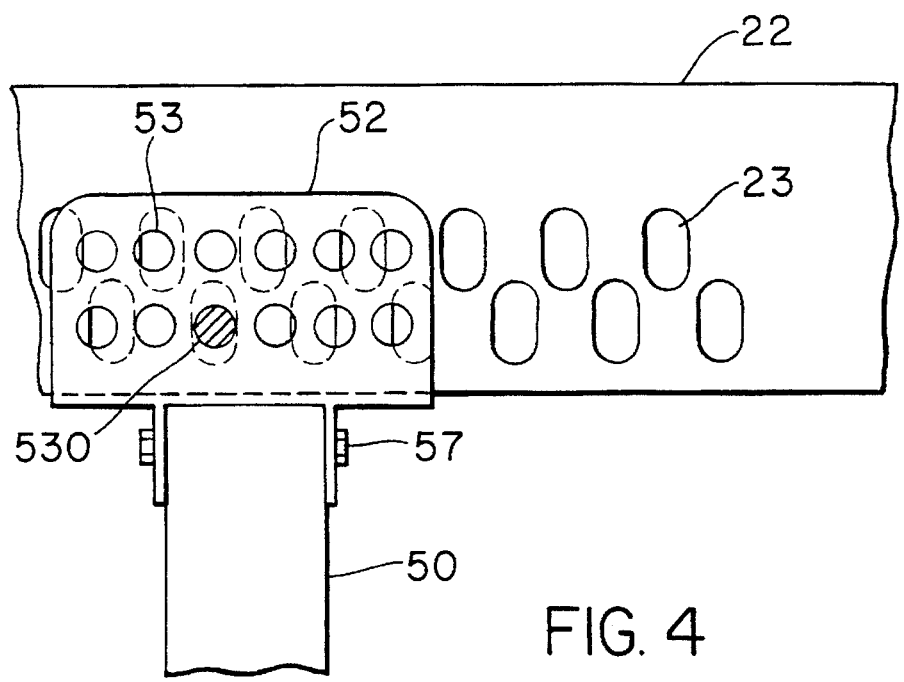
FIG. 4 is a partially-fragmented, elevation illustrating the attachment of the tab to the frame member in the first embodiment.

FIGS. 4 and 5 illustrate the connection between tab 52 and frame member 22. The arrangement of holes 53 on tab 52 in relation to the openings 23 on frame member 22 is such that in a preferred embodiment, only one hole 53 on tab 52 will align with one opening 23 on frame member 22 at a time. As panel 50 is moved horizontally along the frame members, a different hole on each of the tabs will align with an opening on each of the frame members. By providing a plurality of holes on the tabs, and a plurality of openings on the frame members, the position of panel 50 may be more finely adjusted than would be possible using a tab with only a single hole.

It should be noted that, while the present embodiment depicts only the openings on the frame member as elongated, the holes on the tab member may be elongated instead of, or in the addition to, the openings. Elongating the openings and/or holes, as stated above, compensates for any vertical misalignment between the frame and tab.

Figure 6:
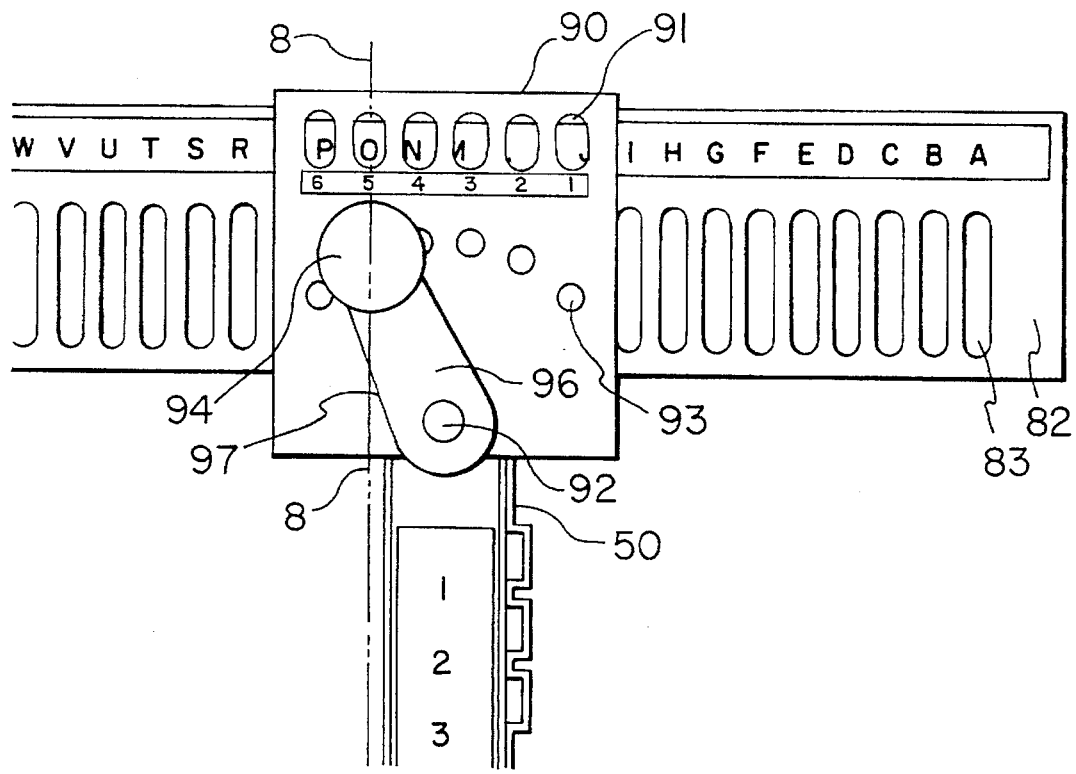
FIG. 6 is an elevation illustrating the attachment of the tab to the frame in a second embodiment.
Figure 7:
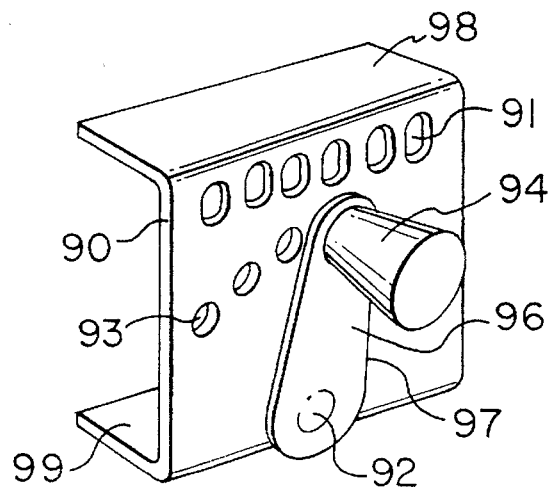
FIG. 7 is a perspective view illustrating the tab used in the second embodiment.
Figure 8:
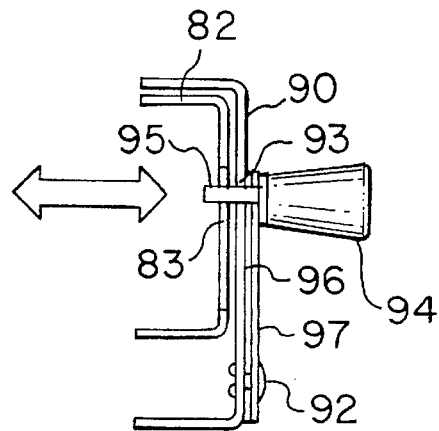
FIG. 8 is a cross-sectional view taken along line 8—8 in FIG. 6 illustrating attachment of the tab to the frame in the second embodiment.

Another embodiment of an attachment mechanism between a tab and a frame is illustrated in FIGS. 6 through 8. Frame member 82, like frame member 22 illustrated in FIGS. 1, 2, 4, and 5, may be supported between vertical support posts 12 and 14. Unlike frame member 22, however, openings 83 on frame member 82 are not staggered. Elongated openings 83 are instead positioned horizontally across frame member 82. In this embodiment, the holes and openings are preferably 0.188 inches.

Tab member 90 shown in FIGS. 6 through 8 has six holes disposed in an arc-like configuration. Adjacent holes are spaced so that the horizontal distance between center lines of adjacent holes is constant. Tab member 90, as shown in FIG. 7, has upper and lower horizontal portions 98 and 99 sized to accommodate frame member 82 therebetween with enough space for tab member 90 to be movable along frame member 82. Lower portion 99 is attachable to a top edge of panel 50. For instance, a screw or the like may be used to attach lower portion 99 to panel 50.

The distance between the vertical center lines of the openings on frame member 82 in the embodiment shown in FIGS. 6 and 7 is 0.35 inches, the same as in the earlier illustrated embodiment. Likewise, the distance between the center lines of the holes on tab member 90 in the embodiment shown in FIGS. 6 and 8 is 0.30 inches, as in the earlier embodiment.

The embodiment shown in FIGS. 6 through 8 uses a positioning assembly 97 to fasten tab member 90 to frame member 82. Plunger 94 on positioning assembly 97 has a stud portion 95 which is removably insertable through one of the holes 93 and into or through an opening 83 aligned with the hole. Plunger 94 may, for example, be a Southco No. 56 spring-loaded plunger.

In the embodiment shown in FIGS. 6 through 8, the arc-like configuration of holes 93 permits stud portion 95 of plunger 94 to be inserted through each of the holes on the tab as lever 96 is pivoted about a pivot point where fastener 92 connects lever 96 to tab member 90 as shown in FIG. 8. Fastener 92, which may be a screw or the like, is inserted through an opening in tab member 90.

To reposition tab member 90 relative to frame member 82, a user pulls plunger 94 outward, thereby withdrawing the stud portion from the opening on frame member 82. Once stud portion 95 is removed, tab 90 may be moved horizontally relative to frame member 82, and lever 96 may be rotated around the pivot point at fastener 92. When tab member 90 is repositioned and a hole 93 is aligned with an opening 82, lever 96 is rotated until plunger 94 is positioned above the aligned hole and opening. Releasing plunger 94 then refastens tab member 90 to frame member 82 by inserting stud portion 95 of plunger 94 through the aligned hole and opening.

The row of elongated windows 91 on tab member 90 allows a user to read the index on frame member 82 above each hole.

The length of the elongated openings of frame member 82 is set so that each elongated opening can accommodate any of the holes on tab member 90, regardless of their position on the arc. This ensures alignment in the vertical direction of the opening and the holes.

To determine the proper positioning of the panels 50 for accommodating a particular size of PCB, the panels are first positioned to approximate the width of the board. Then the position of the panel can be more finely adjusted by using the arrangement of holes and openings, as will be described in detail below.

The present invention, in both its first and second embodiments, utilizes a "vernier"-type spacing system to provide the desired close tolerance as will now be described.

Beginning with one hole 53 on the tab 52 aligned with one opening 23 on the frame member 22, and moving the panel 50 a particular increment or multiple thereof, one of the holes on the tab will align with a different opening on the frame member. The size of the increment necessary to reach the next aligned position depends on the distance between openings on the frame member, on the distance between holes on the tab, and on the number of holes formed in the tab. The distance between holes on the tab must be a positive integer multiple of the increment. The equations below may be used to calculate the incremental distance between positions where a hole on the tab aligns with an elongated opening on the frame and to calculate the spacing between holes on the tab:

$$X = A \div B, \tag{1}$$

where

X is the incremental distance to move a tab from one aligned position to a next aligned position;

A is the distance between vertical center lines of openings on a frame member; and B is the minimum number of columns of holes on the tab;

$$Y = C \div X, \qquad (2)$$

where

C is the distance between the centers of holes in adjacent columns on the tab; and Y must be the smallest positive integer that makes A a multiple of C.

This limitation on Y has the practical effect of determining the minimum number of holes B which will allow the mounting system to function as described herein. This effect can be seen by solving equation (2) for X, substituting A/B from equation (1) for X, and solving that equation for B, yielding:

$$B = \frac{YA}{C}. \qquad (3)$$

This equation must yield an integer because B is the minimum number of holes formed in the tab, and this number, of course, must be a positive integer.

If Y is chosen to be an integer larger than the smallest integer necessary to make A a multiple of C, then there will be more than 1 hole aligned with an opening at the origin, and as the tab is moved in the calculated increments, sometimes no hole and opening will be aligned and sometimes more than one hole and opening will be aligned.

Equation (3) highlights the interrelated nature of the number of holes on the tab, and the distances between holes on the tab, and between openings on the frame. Any suitable combination of these three parameters may be chosen, provided the equation above yields Y, and Y is the smallest positive integer needed to make A an integer multiple of C.

As an example of correctly chosen values for A, B, and C, in one preferred embodiment described above, the distance between openings on the frame member is 0.30 inches. Accordingly, because there are six equally-spaced columns of holes on the tab and a distance of 0.30 inches between openings, the first equation yields the following result:

0.30 in.÷6=0.05 in.

That is, beginning at an aligned position, movement of the panel in increments of 0.05 inches will align one hole on the tab with one opening on the frame member. In the embodiment described above, the distance between openings on the frame is 0.30 inches. The smallest integer that makes A, 0.30 inches, an integer multiple of C, 0.35 inches, is seven. When Y is 7, solving equation (3) for B yields six, the correct number of holes on the tab.

It should be noted that in practical application, a designer may begin by identifying the desired increment needed for the particular application. Using the chosen increment, and either the minimum number of holes on the tab or the distance between openings on the frame member, equation (1) may be solved for the remaining variable. Accordingly, the designer is afforded the flexibility to begin with one or two parameters and determine the remaining parameters from the above equations. In this way, marketing or material constraints can be accommodated in designing the mounting system.

To illustrate the positioning of panel 50 in storage system 10, the data in Table 1 below shows the positions of holes 53 in tab 52 in the embodiment described above. The positions are measured from an origin established for convenience at the center line of the first opening 23 on frame member 22. The data in each column represents the distances from the origin of each of holes 53 in tab 52 after they have been moved the distance indicated for each column. As can be seen from the data in the table, each time tab 52 is moved 0.05 inches, a different hole 53 on tab 52 is located the same distance from origin as one of the openings 23 on frame member 22. With openings 23 on frame member 22 located at fixed distances from origin, each time tab 52 is moved a specified increment, one of the holes 53 on tab 52 aligns with one of the openings 23 on frame member 22. The boldface entry in each column of Table 1 identifies hole 53 on tab 52 which aligns with one of the openings 23 on frame member 22 when tab 52 has been moved the specified distance from origin.

TABLE 1

| frame opening spacing | hole number in tab | distance from origin of 6 holes on tab moved in increments of 0.05 inches in negative direction in relationship to frame | | | | | | |
|---|---|---|---|---|---|---|---|---|
| | | 0.000 | 0.050 | 0.100 | 0.150 | 0.200 | 0.250 | 0.300 |
| 0.000 | 1 | 0.000 | −0.050 | −0.100 | −0.150 | −0.200 | −0.250 | −0.300 |
| 0.300 | 2 | 0.350 | 0.300 | 0.250 | 0.200 | 0.150 | 0.100 | 0.050 |
| 0.600 | 3 | 0.700 | 0.650 | 0.600 | 0.550 | 0.500 | 0.450 | 0.400 |
| 0.900 | 4 | 1.050 | 1.000 | 0.950 | 0.900 | 0.850 | 0.800 | 0.750 |
| 1.200 | 5 | 1.400 | 1.350 | 1.300 | 1.250 | 1.200 | 1.150 | 1.100 |
| 1.500 | 6 | 1.750 | 1.700 | 1.650 | 1.600 | 1.550 | 1.500 | 1.450 |
| 1.800 | | 2.100 | 2.050 | 2.000 | 1.950 | 1.900 | 1.850 | 1.800 |
| 2.000 | | | | | | | | |

As shown in FIGS. 2 through 5, labeling each of the openings 23 using letter and diamond indices 23a and 23b, and labelling each of the holes 53 using number index 53a permits easy duplication of the precise mounting position of panel 50. The position of tab 52 relative to frame member 22 shown in FIGS. 4 and 5, for instance, is identified by specifying attachment of the tab to the frame at the third hole on tab 52 and lower opening B on frame member 22. This indexing assists an engineer planning manufacturing processes, for example, to communicate the specific settings to accommodate PCBs of different sizes to manufacturing personnel.

In the preferred embodiment only one hole and one opening align at a time to facilitate the identification of correct settings for a particular PCB size. However, once the parameters of X, A, C, and Y are determined based on the minimum number of holes B, additional holes may be added, without altering the other parameters. This will result in more than one hole aligning with a corresponding opening at some aligned positions.

To change the distance between opposing panels, all of the pins 530 securing the tabs on one or both panels 50 to the frame members are removed. Each panel is moved to another selected position where again one hole on the tab aligns with one opening on the frame. The panel is then resecured by inserting the pins through the tabs into the frame members at the aligned holes and openings.

Pattern on Panels for Accommodating the Printed Circuit Boards

When attached to the frame members, panels 50 are positioned to accommodate the width of the PCBs so that the edges of the boards can be inserted into grooves formed in the sides of the panels. As described above, panels 50 may have a pattern of raised portions 50a creating a criss-cross arrangement of grooves therebetween. The grooves are sized to closely accommodate the thickness of an edge of a PCB without excessive play therebetween. The PCBs slide into the grooves and are supported by the raised portions.

As shown in FIG. 6 and detailed in FIG. 7, raised portions 50a according to an embodiment of the present invention are arranged in columns across the surface of the panel. The raised portions have a bisected diamond shape with rounded side edges. That is, a diamond shape has been cut horizontally so that the hypotenuses of the approximately triangular-shaped raised portions 50a formed thereby create a horizontal groove therebetween without interfering with the grooves running at an angle on the panel.

Accordingly, the pattern formed on panels 50 of the present invention can hold the PCBs either horizontally or at an angle. The PCBs are schematically illustrated by dotted lines 500 and 501 in FIG. 6. In this manner, the same panel may be used regardless of whether the PCBs are to be supported at an angle or horizontally. This arrangement saves time by eliminating the need to exchange panels depending on the desired storage angle of the board. The angled position allows for storage of a PCB which has a length greater than the depth of panel 50. This arrangement also conserves storage space because separate panels having only horizontal or angled grooves are no longer needed.

The panels 50 may be fabricated from any suitable material. For example, they may be molded from a thermoplastic material using conventional methods.

FIG. 8 shows a cross-sectional view of a portion of panel taken along line 8—8 of FIG. 7. The present invention encompasses panels with grooves formed on both sides of the panel or on only one side of the panel. Although shown as solid, the panel may be hollow to conserve material.

Figure 9:
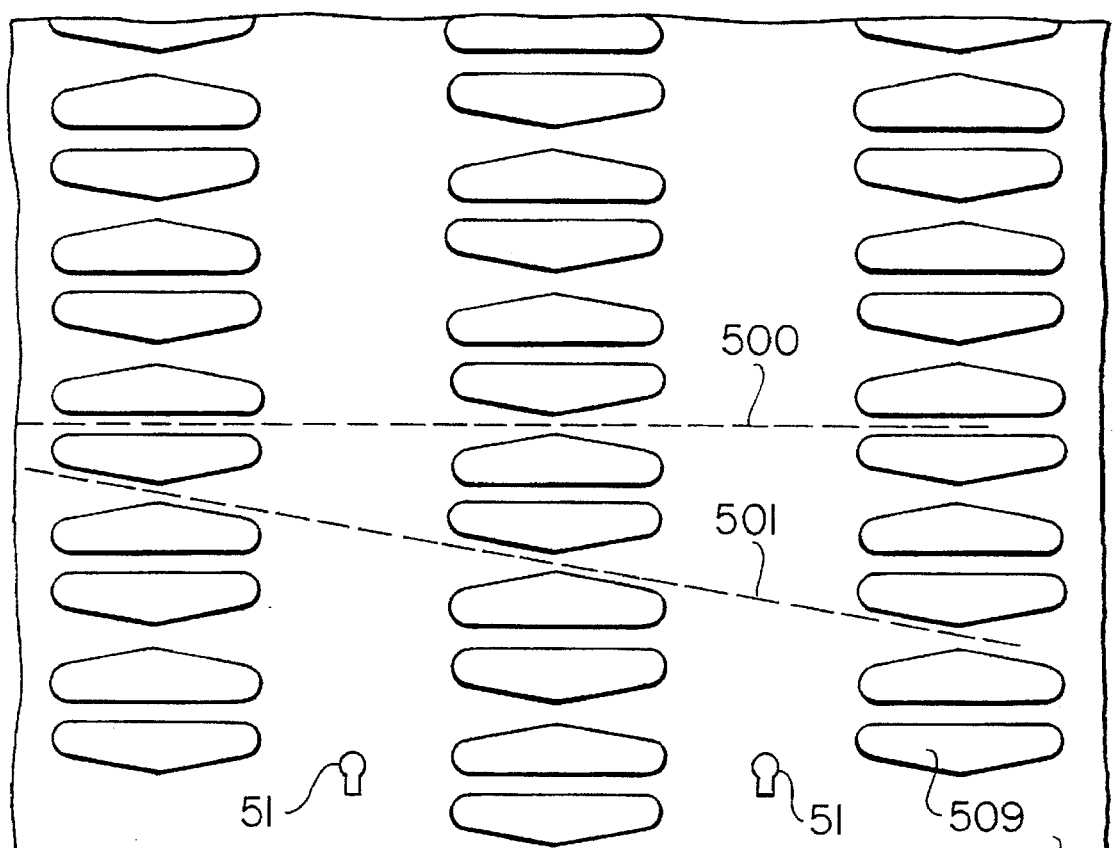
FIG. 9 is a fragmented, elevation of a panel for use in the adjustable storage system shown in FIG. 1.

A partition member 55, shown in FIG. 9, may be detachably mountable on panel 50, as shown in FIG. 1. Partition member 55 abuts an edge of a PCB and serves as a stopper to divide the panel longitudinally into two portions. This permits the panel to hold two columns of PCBs with each column being inserted from opposite sides of the panel. Partition member 55 prevents damage that could result from contact between the PCBs in adjacent columns. One example of a partition member is described in U.S. Pat. No. 4,382,517 incorporated herein by reference. For example, Col. 4, line 49 through Col. 5, line 49, and FIGS. 3 and 4 of the '517 patent describes a partition member.

Figure 10:
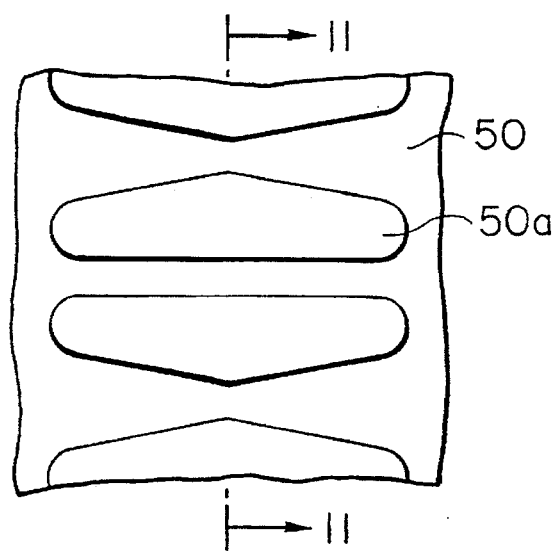
FIG. 10 is a detailed view of a portion of the panel illustrated in FIG. 9.
Figure 11:
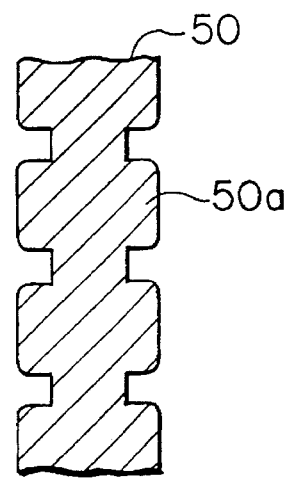
FIG. 11 is a cross section of the panel taken along line 11—11 in FIG. 10 showing grooves formed between raised portions of the panel.
Figure 13:
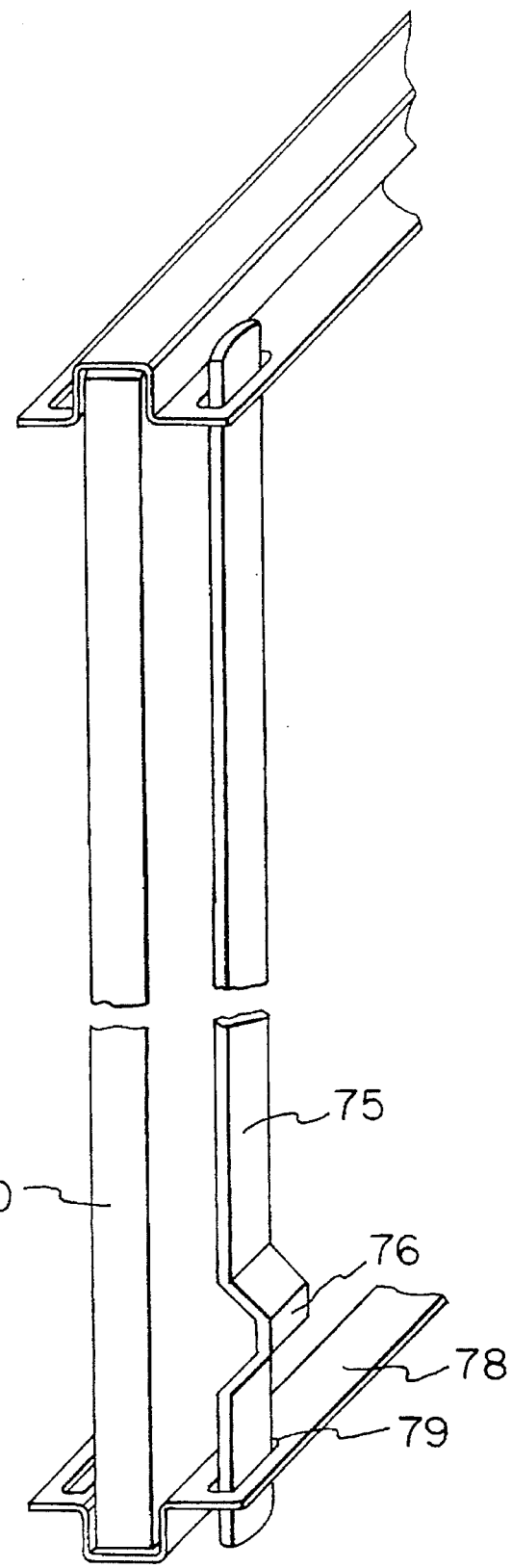
FIG. 13 is a perspective view of another embodiment of a partition member.

FIG. 10 illustrates an alternative embodiment of a partition member. In this embodiment, upper and lower "hat-shaped" channel members 77 are secured to the top and bottom of panel 50. The channel members include lateral extension portions 78 within which slots 79 are formed. The slots on the lateral extension portion of the top channel member are vertically aligned with those on the lateral extension portion of the bottom channel member. As shown in FIG. 10, the ends of partition member 75 extend through vertically aligned top and bottom slots 79. Partition member 75 has a formed portion 76 near its lower end. The formed portion extends horizontally by a distance sufficient to rest on the lateral portion of the lower channel member adjacent to slot 79 and prevent partition member 75 from sliding through the lower slot 79.

Various modifications of the described embodiment will suggest themselves to those skilled in the art. However, it is to be understood that the present disclosure relates to a preferred embodiment of the invention which is for purposes of illustration only and is not to be construed as a limitation of the invention. For example, a stationary cabinet may be used instead of the storage system described herein.

What is claimed is:

1. An adjustable mounting system comprising:
    a tab having a plurality of holes formed therein at first intervals across said tab;
    a support member having a plurality of openings formed therein at second intervals different from the first intervals;
    a fastener detachably positioning said member and said tab by passing through one of the plurality of openings and one of the plurality of holes aligned with the one of the plurality of openings,
    wherein the first and second intervals and a number of the plurality of holes are selected so that, at an aligned position, said fastener is insertable in the one aligned hole and opening,
    wherein a different one of a plurality of holes aligns with one of the plurality of openings as said tab is moved an incremental distance from one aligned position to a next aligned position, and
    wherein the first and second intervals, the number of the plurality of holes, and the incremental distance are selected to satisfy the following:
    $X=A/B$, and
    $Y=C/X$,
    where
    X is the incremental distance to move said tab from one aligned position to the next aligned position,
    A is the distance between vertical center lines of adjacent openings on said member defining the second regular interval;
    B is the minimum number of holes formed on said tab;
    C is a distance between centers of adjacent holes on said tab defining the first regular interval; and
    Y is a smallest positive integer making C an integer multiple of A.

2. An adjustable mounting system according to claim 1, wherein the plurality of openings on said member are elongated.

3. An adjustable mounting system according to claim 1, wherein the plurality of openings on said member are arranged in two staggered rows.

4. An adjustable mounting system according to claim 1, further comprising an index for identifying each of the plurality of openings on said member.

5. An adjustable mounting system according to claim 1, wherein the plurality of holes on said tab are circular.

6. An adjustable mounting system according to claim 5, wherein the plurality of holes are provided in at least two rows across said tab.

7. An adjustable mounting system according to claim 6, wherein centers of the plurality of holes provided in each of the at least two rows are vertically aligned, forming a plurality of vertical columns, each column having at least two holes.

8. An adjustable mounting system according to claim 9, further comprising an index for identifying each column of holes on said tab.

9. An adjustable mounting system according to claim 1, wherein the plurality of holes on said tab are elongated.

10. An adjustable mounting system comprising:
   a tab having a plurality of holes formed therein at first intervals across said tab;
   a support member having a plurality of openings formed therein at second intervals different from the first intervals; and
   a fastener detachably positioning said member and said tab by passing through one of the plurality of openings and one of the plurality of holes aligned with the one of the plurality of openings, said fastener comprising:
      a lever;
      a stud connected to said lever and being removably insertable into the aligned hole and opening; and
      securing means for securing said lever to said tab member, said lever being rotatable about said securing means,
   wherein the first and second intervals and a number of the plurality of holes are selected so that, at an aligned position, said fastener is insertable in the one aligned hole and opening.

11. An adjustable mounting system according to claim 10, said fastener further comprising:
   a plunger to which said stud is attached.

12. An adjustable mounting system according to claim 11, wherein said plunger comprises a spring-loaded type plunger.

13. An adjustable mounting system according to claim 12, wherein said plunger functions to retract said stud from and release said stud into an opening aligned with an aligned hole, thereby allowing repositioning of said tab member relative to said frame member.

14. An adjustable mounting system according to claim 10, wherein the plurality of holes are formed in substantially an arc-shape.

15. An adjustable mounting system according to claim 1, further comprising a bracket attached to said tab, and a panel attached to said bracket, said panel having grooves formed thereon to accommodate substantially planar articles.

16. An adjustable mounting system comprising:
   a pair of panels having grooves disposed thereon to accommodate substantially planar articles;
   a pair of tabs attached to each one of said pair of panels, each of said pairs of tabs having a plurality of holes formed thereon at first regular intervals;
   a pair of upper horizontal frame members and a pair of lower horizontal frame members, said pairs of upper and lower horizontal frame members having a plurality of openings formed thereon at second regular intervals different from the first regular intervals;
   a connecting member removably insertable through one of the plurality of holes and one of the plurality of openings aligned with one of the plurality of holes for each of said pairs of tabs,
   wherein a different one of a plurality of holes aligns with one of the plurality of openings as each of said pairs of tabs is moved an incremental distance along said pairs of upper and lower horizontal frame members from one aligned position to a next aligned position,
   wherein the first and second intervals, the number of the plurality of holes, and the incremental distance are selected to satisfy the following:
      X=A/B, and
      Y=C/X,
   where
      X is the incremental distance to move said tab from one aligned position to the next aligned position,
      A is a distance between vertical center lines of adjacent openings on said pairs of upper and lower horizontal frame members defining the second regular interval;
      B is the minimum number of holes formed on said tab;
      C is a distance between centers of adjacent holes on said pairs of tabs defining the first regular interval; and
      Y is a smallest positive integer making C an integer multiple of A.

17. An adjustable mounting system according to claim 16, wherein the plurality of openings on said pairs of upper and lower horizontal frame members are elongated.

18. An adjustable mounting system according to claim 16, wherein the plurality of openings on said pairs of upper and lower horizontal frame members are arranged in two staggered rows.

19. An adjustable mounting system according to claim 16, further comprising an index for identifying each of the plurality of openings on said pairs of upper and lower horizontal frame members.

20. An adjustable mounting system according to claim 16, wherein the plurality of holes on said pairs of tabs are circular.

21. An adjustable mounting system according to claim 20, wherein the plurality of holes are provided in at least two rows across said pairs of tabs.

22. An adjustable mounting system according to claim 21, wherein centers of the plurality of holes provided in each of the at least two rows are vertically aligned, forming a plurality of vertical columns, each column having at least two holes.

23. An adjustable mounting system according to claim 22, further comprising an index for identifying each of the vertical columns of on each of said pairs of tabs.

24. An adjustable mounting system according to claim 16, wherein the plurality of holes on each of said pairs of tabs are elongated.

25. An adjustable mounting system comprising:
   a pair of panels having grooves disposed thereon to accommodate substantially planar articles;
   a pair of tabs attached to each one of said pair of panels, each of said pairs of tabs having a plurality of holes formed thereon at first regular intervals; and
   a pair of upper horizontal frame members and a pair of lower horizontal frame members, said pairs of upper and lower horizontal frame members having a plurality of openings formed thereon at second regular intervals different from the first regular intervals; and
   a connecting member removably insertable through one of the plurality of holes and one of the plurality of openings aligned with one of the plurality of holes for each of said pairs of tabs, said connecting member comprising:
      a lever;
      a stud connected to said lever and being removably insertable into the aligned hole and opening for each of said pairs of tabs; and securing means for securing said lever to each of said pairs of tabs, said lever being rotatable about said securing means.

26. An adjustable mounting system according to claim 25, said connecting member further comprising:
a plunger to which said stud is attached.

27. An adjustable mounting system according to claim 26, wherein said plunger comprises a spring-loaded type plunger.

28. An adjustable mounting system according to claim 27, wherein said plunger functions to retract said stud from and release said stud into an opening aligned with an aligned hole, thereby allowing repositioning of said tab member relative to said frame member.

29. An adjustable mounting system according to claim 25, wherein the plurality of holes are formed in substantially an arc-shape.

30. A mounting system for supporting panels, said mounting system comprising:
a supporting member having a plurality of openings formed therein;
at least one tab member supportable by said supporting member, said tab member having a plurality of holes formed therein;
a positioning member insertable in a pair of an aligned opening and hole,
wherein a different one of the plurality of holes aligns with one of the plurality of openings as said tab member is moved an incremental distance from one aligned position to a next aligned position, and
wherein the distance between adjacent openings on said supporting member, the distance between adjacent holes on said tab member, a number of the plurality of holes, and the incremental distance are selected to satisfy the following:
X=A/B, and
Y=C/X,
where
X is the incremental distance to move said tab member from one aligned position to the next aligned position,
A is a distance between vertical center lines of adjacent openings on said supporting member;
B is the minimum number of holes formed on said tab member;
C is a distance between centers of adjacent holes on said tab member; and
Y is a smallest positive integer making C an integer multiple of A.

31. A mounting system according to claim 30, wherein the plurality of openings on said supporting member are elongated.

32. A mounting system according to claim 30, wherein the plurality of openings on said supporting member are arranged in two staggered rows.

33. A mounting system according to claim 30, further comprising an index for identifying each of the plurality of openings on said supporting member.

34. A mounting system according to claim 30, wherein the plurality of holes on said tab member are circular.

35. A mounting system according to claim 34, wherein the plurality of holes are provided in at least two rows across said tab member.

36. A mounting system according to claim 35, wherein centers of the plurality of holes provided in each of the at least two rows are vertically aligned, forming a plurality of vertical columns, each column having at least two holes.

37. A mounting system according to claim 36, further comprising an index for identifying each of the vertical columns on said tab member.

38. An adjustable mounting system according to claim 30, wherein the plurality of holes on said tab member are elongated.

39. A mounting system for supporting panels, said mounting system comprising:
a supporting member having a plurality of openings formed therein;
at least one tab member supportable by said supporting member, said tab member having a plurality of holes formed therein; and
a positioning member insertable in a pair of an aligned opening and hole, said positioning member comprising:
a lever;
a stud connected to said lever and being removably insertable into the aligned hole and opening; and
securing means for securing said lever to said tab member, said lever being rotatable about said securing means.

40. An mounting system according to claim 39, said positioning member further comprising:
a plunger to which said stud is attached.

41. An mounting system according to claim 40, wherein said plunger comprises a spring-loaded type plunger.

42. An mounting system according to claim 41, wherein said plunger functions to retract said stud from and release said stud into an opening aligned with an aligned hole, thereby allowing repositioning of said tab member relative to said frame member.

43. An mounting system according to claim 42, wherein the plurality of holes are formed in substantially an arc-shape.

44. A mounting system according to claim 30, further comprising
at least one panel; and
a bracket attached to said tab member, said at least one panel being attached to said bracket, said at least one panel having grooves formed thereon to accommodate substantially planar articles.

45. An adjustable storage system comprising:
a plurality of support posts;
a pair of upper frame members and a pair of lower frame members removably mounted to one of said plurality of support posts at each end of each of said plurality of frame members, each of said frame members being disposed perpendicularly to each of said support posts and each of said frame members having a plurality of openings being disposed across a surface thereof;
a pair of upper side members and a pair of lower side members associated, respectively, with each of said pair of upper frame members and said pair of lower frame members, each of said plurality of side members being removably mounted to one of said plurality of support posts at each end of each of said plurality of side members, each of said plurality of side members being disposed perpendicularly to each of said support posts and to each of said frame members;
a plurality of panels disposed vertically, at least one of said plurality of panels being movable and comprising a pair of tab members secured to a top edge of each panel and a pair of tab members secured to a bottom edge of each panel, said tab members having a plurality of holes disposed across a surface thereof, said holes being disposed such that only one of said holes of each tab at any one time aligns with one of said openings of said frame members proximate to said tab; and a plurality of fastening members being inserted in said aligned holes and openings for attaching said plurality of tab members to each of said plurality of frame members.

46. An adjustable storage system according to claim 45, wherein said openings are arranged in two staggered rows.

47. An adjustable storage system according to claim 46, further comprising an index for identifying each of said openings.

48. An adjustable storage system according to claim 45, further comprising an index identifying each of said holes.

49. An adjustable storage system according to claim 45, wherein each of said plurality of panels further comprises a partition member detachably mountable thereon for dividing each of said plurality of panels into at least two longitudinal sections.

50. An adjustable storage system according to claim 45, further comprising a plurality of collars, each of said plurality of collars being removably secured to an end of a frame member and an end of a side member, wherein said collars are removably secured to said support posts.

51. An adjustable storage system according to claim 45, further comprising at least one shelf removably mounted to each of said support posts, said shelf comprising (i) a plurality of side portions being joined at a plurality of collars to form a substantially rectangular frame assembly, and (ii) a platform secured to said side portions.

52. An adjustable storage system according to claim 51, wherein said side portions and said platform comprise wire rods.

53. An adjustable storage system according to claim 45, further comprising a plurality of casters, each of said plurality of casters being secured to movably support said storage system.

54. An adjustable mounting system according to claim 45, wherein the plurality of holes on each one of said pair of tab members are elongated.

55. An adjustable mounting system according to claim 45, each of said plurality of fastening members comprising:

a lever;

a stud connected to said lever and being removably insertable into the aligned hole and opening; and securing means for securing said lever to each one of said pair of tab members, said lever being rotatable about said securing means.

56. An adjustable mounting system according to claim 55, each of said plurality of fastening members further comprising:

a plunger to which said stud is attached.

57. An adjustable mounting system according to claim 56, wherein said plunger comprises a spring-loaded type plunger.

58. An adjustable mounting system according to claim 57, wherein said plunger functions to retract said stud from and release said stud into an opening aligned with an aligned hole, thereby allowing repositioning of said tab member relative to said frame member.

59. An adjustable mounting system according to claim 55, wherein the plurality of holes are formed in substantially an arc-shape.

* * * * *

UNITED STATES PATENT AND TRADEMARK OFFICE
CERTIFICATE OF CORRECTION

PATENT NO. : 5,660,122

DATED : August 26, 1997

INVENTOR(S) : WILLARD J. SICKLES ET AL.

It is certified that error appears in the above-identified patent and that said Letters Patent is hereby corrected as shown below:

COLUMN 2

Line 32, "recesses;" should read --recesses,--.

COLUMN 5

Line 20, "openings" should read --the openings--.

Line 46, "the" (first occurrence) should be deleted.

COLUMN 12

Line 43, "of" (first occurrence) should be deleted.

COLUMN 14

Line 22, "An" should read --A--.

Line 25, "An" should read --A--.

Line 27, "An" should read --A--.

UNITED STATES PATENT AND TRADEMARK OFFICE
CERTIFICATE OF CORRECTION

PATENT NO. : 5,660,122

DATED : August 26, 1997

INVENTOR(S): WILLARD J. SICKLES ET AL.

It is certified that error appears in the above-identified patent and that said Letters Patent is hereby corrected as shown below:

<u>COLUMN 14</u>

Line 32, "An" should read --A--.

Signed and Sealed this

Eighteenth Day of August, 1998

Attest:

BRUCE LEHMAN

Attesting Officer

Commissioner of Patents and Trademarks